United States Patent [19]

Juskey et al.

[11] Patent Number: 5,264,061
[45] Date of Patent: Nov. 23, 1993

[54] METHOD OF FORMING A THREE-DIMENSIONAL PRINTED CIRCUIT ASSEMBLY

[75] Inventors: Frank J. Juskey; Anthony B. Suppelsa; Dale W. Dorinski, all of Coral Springs, Fla.

[73] Assignee: Motorola, Inc., Schaumburg, Ill.

[21] Appl. No.: 964,682

[22] Filed: Oct. 22, 1992

[51] Int. Cl.$^5$ .................. B05D 5/12; B29C 35/08; B29C 41/02

[52] U.S. Cl. .................. 156/214; 29/848; 29/849; 29/850; 156/221; 156/272.8; 156/273.5; 156/275.5; 156/307.1; 264/22; 264/25; 264/236; 264/272.17; 264/308; 264/322; 427/96; 427/98; 427/393.5; 427/446; 427/493; 427/508; 427/510; 427/512; 427/521; 427/553; 427/554; 427/581; 437/230

[58] Field of Search .......... 264/22, 25, 236, 272.17, 264/308, 322; 156/214, 221, 272.8, 273.3, 273.5, 275.5, 307.1; 427/96, 98, 385.5, 393.5, 446, 493, 508, 510, 512, 521, 553, 554, 581; 29/846, 848, 849, 850; 437/230

[56] References Cited

U.S. PATENT DOCUMENTS

| | | | |
|---|---|---|---|
| 4,929,402 | 5/1990 | Hull | 264/22 |
| 4,996,010 | 2/1992 | Modrek | 264/22 |
| 4,999,143 | 3/1991 | Hull | 264/22 |
| 5,008,496 | 4/1991 | Schmidt et al. | 174/254 |
| 5,173,220 | 12/1992 | Reiff et al. | 264/22 |

Primary Examiner—Leo B. Tentoni
Attorney, Agent, or Firm—Dale W. Dorinski

[57] ABSTRACT

A three-dimensional printed circuit assembly is formed by first making a substrate (20). A substrate (20) is first formed from a photoactive polymer (14) that is capable of altering its physical state when exposed to a radiant beam (30). At this point, the substrate is only partially cured. A conductive circuit pattern (50) is then formed on the partially cured substrate. The substrate is then molded to create a three-dimensional structure, and then further cured to cause the photoactive polymer to harden.

14 Claims, 4 Drawing Sheets

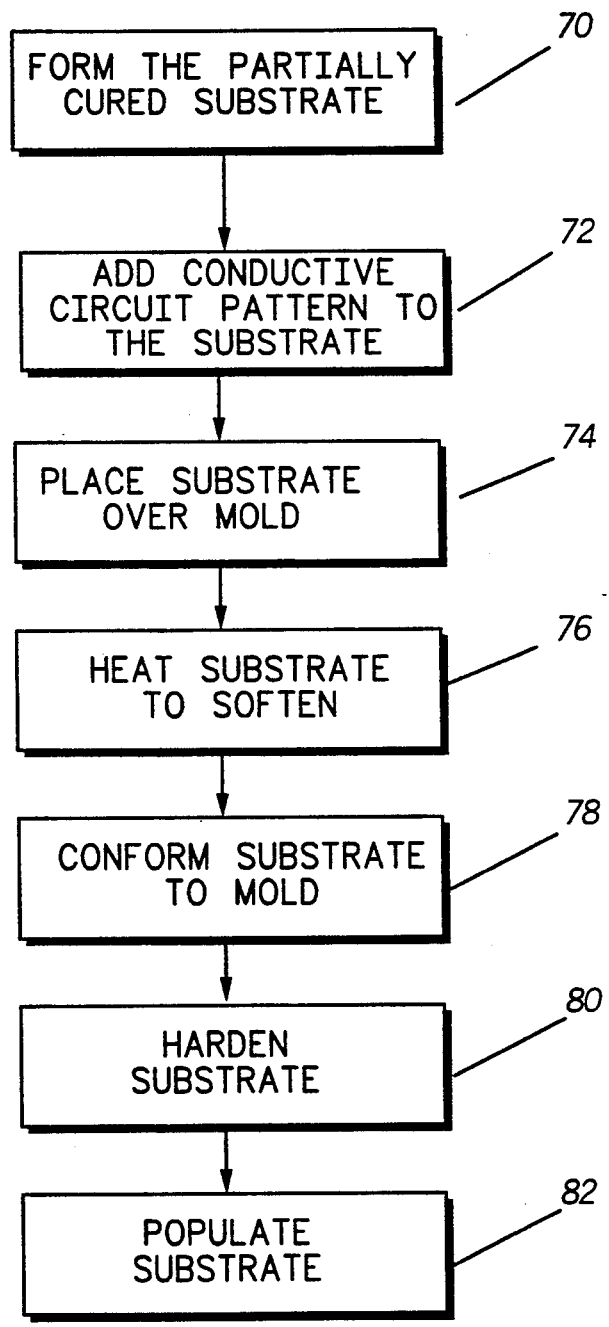

METHOD OF FORMING A THREE-DIMENSIONAL PRINTED CIRCUIT ASSEMBLY

CROSS REFERENCE TO RELATED APPLICATIONS

This application is related to application serial number 07/691,769 filed Apr. 26, 1991, and assigned to Motorola Inc.

TECHNICAL FIELD

This invention relates generally to a method of making printed circuit substrates, and more particularly to a method of making three-dimensional printed circuits.

BACKGROUND

It is common practice in the production of electronic assemblies to first design the assembly and then painstakingly produce a prototype, each step involving considerable time, effort, and expense. The prototype is then revised, and often times the process is repeated until the design has been optimized. After optimization, the next step is production. Since the design time and tooling costs are very high, electronic assemblies are usually practiced only in high-volume production. Alternate cost effective processes are not available for the production of low-volume parts, and these low-volume parts are usually inferior in quality to production parts.

Current technology for three-dimensional circuits requires that a three-dimensional substrate be formed first, then the conductors are formed on the substrate in a photolithography process. Three-dimensional circuits with multilayer conductors or fine lines and spaces incur a high cost. While many have endeavored to manufacture three-dimensional circuits in various ways, each requires expensive custom molds and phototools. Because of the high capital expense and the long lead times required to produce these types of circuits, they are typically limited to those situations where high volumes, long lead times, or high profit margins can justify the complexity. Hence, there continues to be a need in the design and production of three-dimensional circuits for an enhanced capability to rapidly and reliably move from the design stage to a prototype stage, and then to low cost production. Accordingly, those concerned with the production of these types of circuits have long recognized the desirability of a rapid, reliable, and economical method to fabricate complex three-dimensional circuits. The present invention fulfills these needs.

SUMMARY OF THE INVENTION

Briefly, according to the invention, there is provided a method of making a three-dimensional printed circuit assembly. A substrate is first formed from a photoactive polymer that is capable of altering its physical state when exposed to a radiant beam. At this point, the substrate is only partially cured. A conductive circuit pattern is then formed on the partially cured substrate. The substrate is then molded to create a three-dimensional structure, and then further cured to cause the photoactive polymer to harden completely.

In an alternate embodiment of the invention, a method of making a radio having a three-dimensional printed circuit board is presented. A three-dimensional printed circuit board is created by forming a substrate by means of stereolithography, the substrate being only partially cured. A conductive circuit pattern is formed on the substrate. The substrate is shaped to provide three-dimensional features by heating and softening it to cause it to assume the shape of a mold form. The substrate is cured further to cause it to harden into the desired shape, and is then populated with components to create a portion of the radio circuitry.

BRIEF DESCRIPTION OF THE DRAWINGS

FIG. 6 is a block diagram of the steps involved in making a three-dimensional printed circuit in accordance with the present invention.

DETAILED DESCRIPTION OF THE PREFERRED EMBODIMENT

The present invention provides a new and improved method of fabricating a three-dimensional circuit by forming successive adjacent layers of that object at the surface of a medium capable of altering its physical state in response to an appropriate synergistic stimulation. In the preferred embodiment, by way of example and not necessarily by way of limitation, the present invention utilizes the principles of stereolithography to create electronic assemblies. Stereolithography is a method for making solid objects by successively forming thin layers of a solid material, one layer on top of the other. The solid material is formed by selectively exposing portions of a liquid or powdered material to a source of energy. The material may be, for example, a metal or plastic powder that is heated to cause melting or fusing of the powder, a chemically reactive material that cures on exposure to a second chemical, or a liquid photopolymer that cures or polymerizes upon exposure to ultraviolet (UV) light. Such systems undergo a physical transformation by synergistic stimulation of the material. In the preferred embodiment, a UV curable liquid photopolymer is employed.

A number of stereolithography systems or methods have been proposed or are currently existing. The most popular of these is a method of curing a liquid photopolymer with ultraviolet light. Suitable techniques for performing stereolithography are disclosed in U.S. Pat. Nos. 4,929,402 and 4,999,143, incorporated herein by reference. Other methods include sintering metals or powders using a laser light beam, focused heat, x-ray beams, visible light beams, high energy particles, an electron beam, chemically reacting a material with a jet of a reactant material, or by placing a mask over the surface of the uncured material, the mask having openings corresponding to the physical features of the desired object. When such a mask is used, a concentrated beam is not required and the surface of the material may then be flooded with the energy source, for example, flooding with ultraviolet light, heat, or a chemical source.

Many types of complex three-dimensional forms can be created with the technique of stereolithography. In the present invention, the stereolithographic technique is used to form a substrate for a three-dimensional printed circuit assembly.

Figure 1:
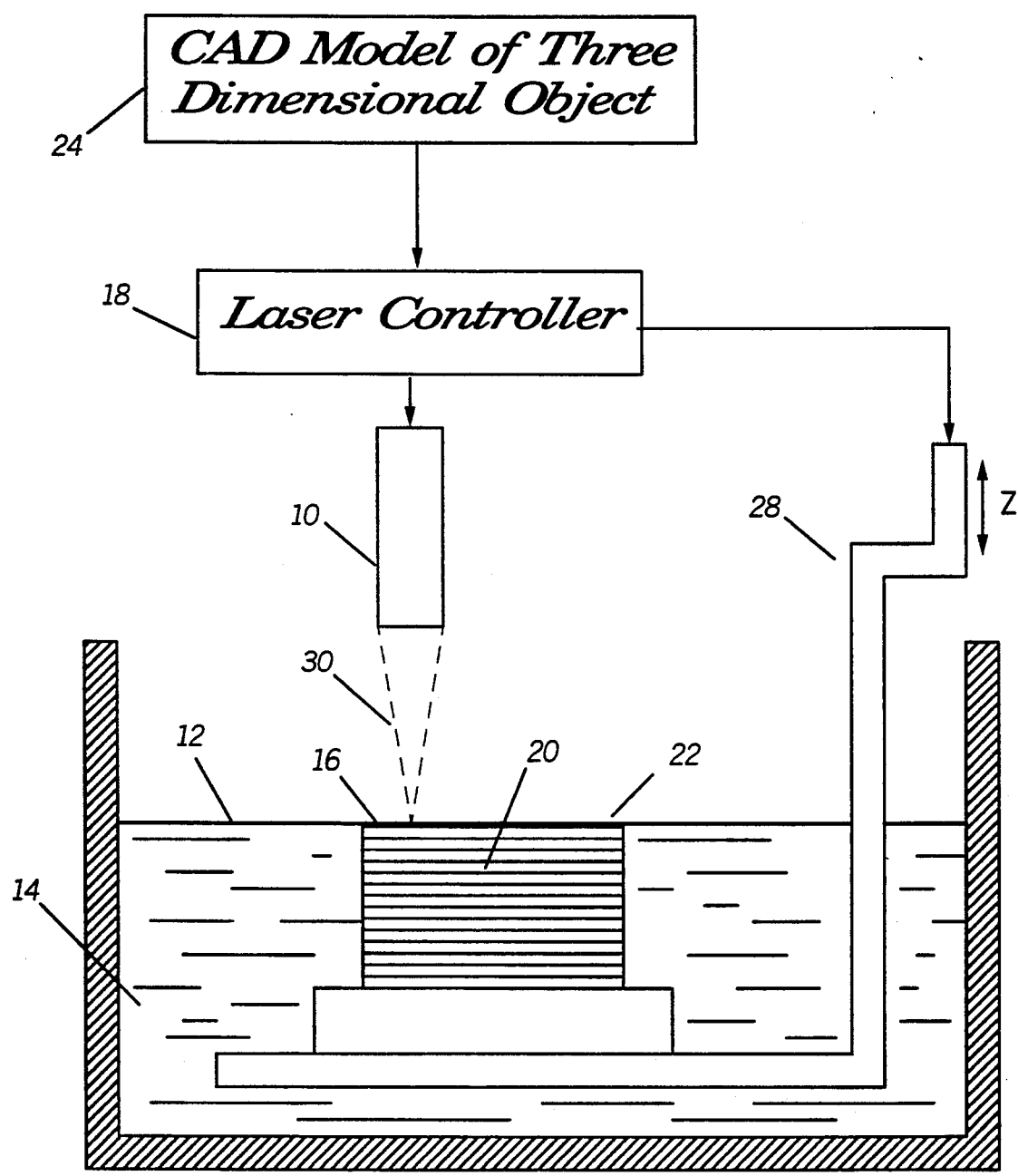
FIG. 1 is a schematic of a substrate being fabricated in a stereolithography apparatus in accordance with the present invention.

Referring now to FIG. 1, the programmable beam 30 of an ultraviolet laser 10 serves as the energy source, and is moved across the surface 12 of a UV curable liquid material 14 in order to convert selected portions 16 of the liquid to a solid. A solid polymer is thus formed at the surface of the liquid. The UV light beam 30 is controlled by a laser controller or computer 18 and partially cures the photopolymer material in areas corresponding to the computer based model 24 of the substrate 20. It is important to note that in this step, the polymer is only partially cured, and is not completely cured. The chemical reaction that occurs during this stage is often referred to as a 'B-Stage' cure, meaning that the liquid has been partially crosslinked by the light beam to form a solid material, but the solid material must still be cured further. The partially formed substrate 20 is then moved away from the liquid surface 12 by lowering the stage 28 in order to recoat the surface of the substrate with uncured material 14, forming a thin layer 22 of uncured material over the substrate surface. Another solid layer is then created in a manner similar to the first solid layer by again rastering the UV light beam and selectively curing the material. Because each of the layers has a finite thickness and the penetration depth of the laser beam 30 is also finite and controllable, successive layers adhere to the layer immediately beneath to form a solid structure. The process is continued until the desired thickness is reached.

Figure 2:
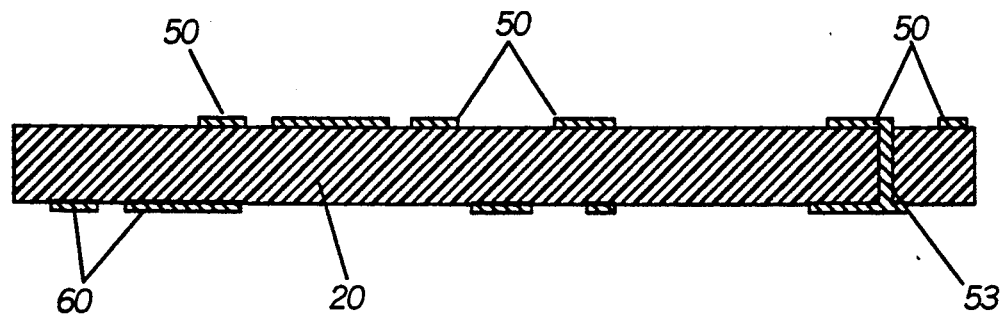
FIG. 2 is a cross-sectional view of a circuit board in accordance with the present invention.

Referring now to FIG. 2, the substrate 20 is then removed from the stereolithography apparatus, and a conductive circuit pattern 50 is formed on the substrate. The pattern 50 may be formed by a number of methods, known in the art, such as thin film lithography, electroless plating, plasma flame spraying, screen printing conductive materials (such as inks, pastes, or conductive polymers), applying a decal having conductive runners, or laminating another circuit carrying substrate such as a polyimide flex circuit. In forming the circuit pattern 50, care should be taken to insure that the substrate 20 is not deformed. Via holes 53 may also be present in the conductive circuit pattern 50.

Figure 3:
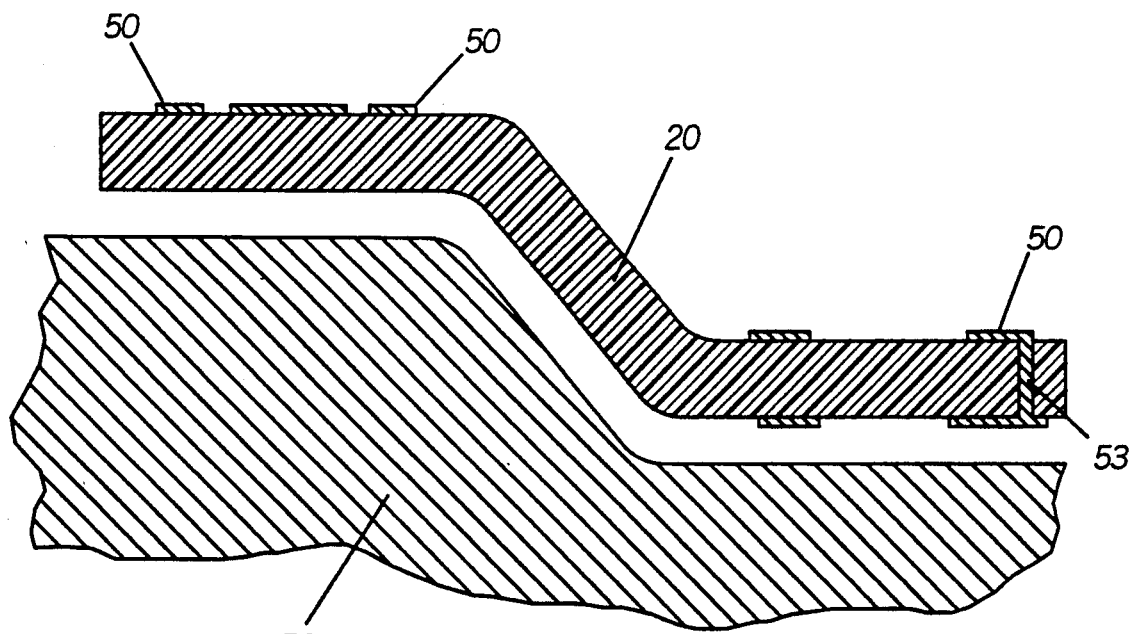
FIG. 3 is a cross-sectional view of a three-dimensional circuit board in accordance with the present invention.

The substrate 20 with the conductive circuit pattern 50 is now ready for the next step, which consists of forming it into the desired three-dimensional shape. This can be accomplished in several ways, the preferred embodiment shown in FIG. 3 being to use a male mold shape 56 to form the substrate 20. A male mold is one that possess the opposite or negative shape as the desired object, and is common in the plastics forming industry. The mold is used as the pattern or template to shape the malleable plastic substrate. Since the substrate formed by the laser beam in the stereolithography apparatus is not yet completely cured, it is easily shaped by heating. For example, the substrate may be placed across the mold and heated in an oven to a temperature sufficient to cause the substrate to soften. Additional impetus to the forming operation may be added by the use of vacuum or air pressure, as in vacuum thermoforming techniques. Additionally, another part of a mold may be impressed upon the softened substrate to cause it to conform to the first mold. The reader skilled in the art of thermo-forming will readily appreciate these techniques, and also understand that other methods common in the industry may be applied to form the substrate with suitable efficiency.

As the temperature rises, and the board 20 conforms to the mold 56, a latent thermal crosslinking agent in the polymer begins to react with the polymer to cure it. This causes the polymer to harden, and the substrate 20 retains its shape when removed from the mold. The circuit is now ready for the step of assembling components.

Figure 4:
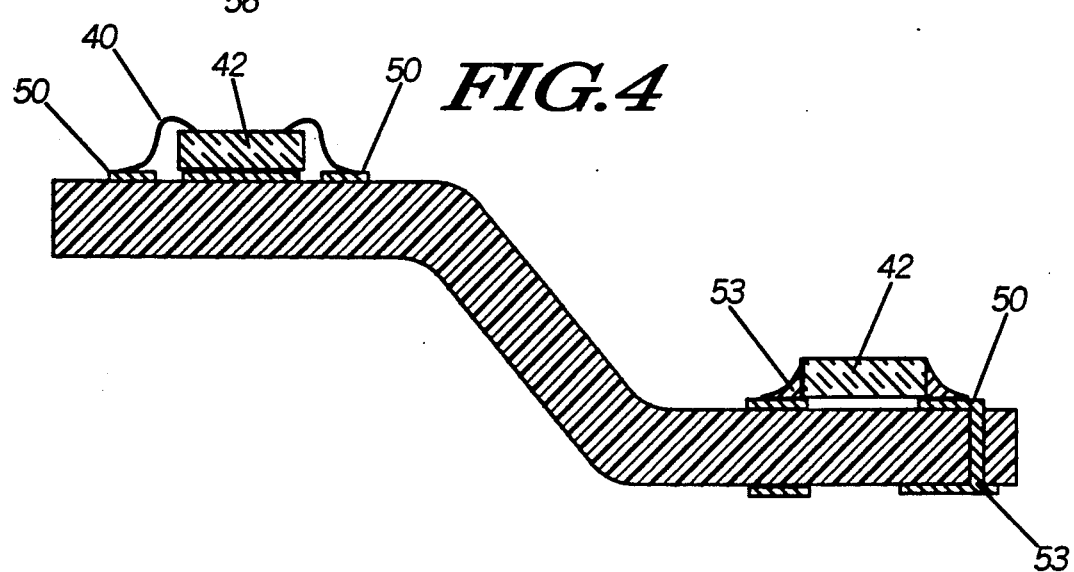
FIG. 4 is a cross-sectional view of a populated three-dimensional circuit board in accordance with the present invention.

Referring now to FIG. 4, active or passive components 42 such as integrated circuits, chip resistors, and capacitors may be connected to the conductive circuit pattern 50 via conductive adhesive, solder 53, or wirebonds 40. If desired, an additional layer of dielectric material may be formed upon the three-dimensional circuit board with stereolithography techniques. This second layer may serve as an encapsulant, providing protection to the conductive circuit pattern, or it may serve as a foundation upon which another conductive circuit pattern, may be formed. The additional conductive circuit pattern is typically formed in a manner similar to that used for the first conductive circuit pattern. Via holes allow this conductive circuit pattern to be electrically connected to the first conductive circuit pattern, because the vias act as plated through holes (or filled vias in the case of conductive inks or pastes). Additional layers of dielectric and conductive circuitry may be continued if desired. These dielectric layers can be used for supporting other mechanical features such as pins or other means of connecting to external parts such as speakers and microphones. This layer can also be used as an exterior wall of the completed substrate.

If desired, additional components may be added to the assembly after the first or second dielectric layer is completed. In this way, a multilevel structure can be formed with components 42 on differing levels. A number of variations of the above examples will be readily apparent to the reader, and are considered to be within the spirit of the invention. For example, additional dielectric and/or metal layers 60 may also be formed on the opposite side of the substrate to create a two-sided structure as exemplified in FIG. 2.

Depending upon the type of material utilized, a final curing step may be typically performed by flooding the part with ultraviolet light energy or by further heating the part in an oven in order to effect further polymerization. Techniques for effecting the final cure by immersing the fabricated three-dimensional object under water are found in U.S. Pat. No. 4,996,010.

Figure 5:
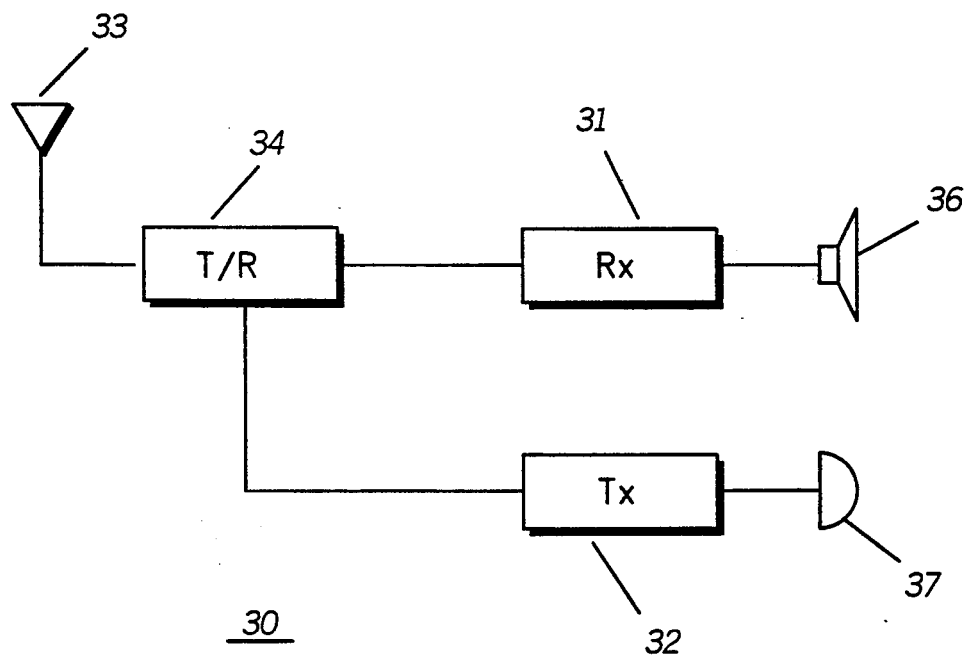
FIG. 5 is a schematic of a radio in accordance with the present invention.

In a further embodiment of the invention, the three-dimensional circuit board as described herein may find particular use in portable communications applications. Referring to FIG. 5, the three-dimensional circuit board of the present invention is utilized in a radio 30 comprising any well-known radio, such as portable two-way radios manufactured by Motorola Inc., which may operate in either receive or transmit modes. The radio 30 includes a receiver section 31 and a transmitter section 32 which comprise means for communicating, that is, transmitting or receiving communication signals for the radio. The receiver or transmitter sections are typically mounted on a printed circuit board or substrate, for example a polymer substrate as described in the instant invention.

In the receive mode, the portable radio 30 receives a communication signal via an antenna 33. A transmit/- receive (T/R) switch 34 couples the received communication signal to the receiver 31. The receiver 31 receives and demodulates the received communications signal and presents its audio component to a speaker 36. It may be appreciated by one of ordinary skill in the art that other functions not herein described may be provided by any suitable means, including a controller means (not shown), which controls the entire operation of the radio 30.

In the transmit mode, audio messages are coupled from a microphone 37, where they are used to modulate a carrier signal as is well known in the art. The modulated carrier signal is then applied to the antenna 33 through the T/R switch 34 for transmission of the communication signal. It may be appreciated that the three-dimensional circuit board, according to the principals of the present invention, may be utilized in suitable sections of the transmitter or receiver sections 32 and 31, respectively.

Referring now to FIG. 6 the steps involved in the process of making a three-dimensional printed circuit board according to the present invention are as follows:

1) The partially cured substrate is formed 70 in the stereolithography apparatus.

2) A conductive circuit pattern is added to the substrate 72 using any number of conventional methods.

3) The substrate is formed into the three-dimensional shape by placing it over a mold 74, heating the substrate to soften it 76, and causing the substrate to conform to the shape of the mold 78.

4) The shaped substrate is then hardened 80 by further curing by heat or light to cause the photoreactive polymer to crosslink and harden.

5) The three-dimensional circuit is then populated with components 82 by soldering or other means.

An important feature of the present invention resides in the ability to form a three-dimensional conductive circuit by stereolithography. This new and improved method of fabricating a three-dimensional conductive circuit has numerous advantages over conventional techniques. The present invention eliminates the need to produce expensive and costly tooling and allows the designer to work directly with the computer and a stereolithographic device in order to fabricate the desired circuit. The present invention satisfies a long-existing need for an improved method of rapidly, reliably, accurately, and economically fabricating three-dimensional conductive circuits. It will be apparent from the foregoing that while particular forms of the invention have been illustrated and described, various modifications can be made without departing from the spirit and the scope of the invention. Accordingly, it is not intended that the invention be limited except as by the appended claims.

What is claimed is:

1. A method of making a three-dimensional printed circuit assembly, comprising the steps of:
    forming a substrate from a photoactive polymer capable of altering its physical state when exposed to a radiant beam, the substrate being only partially cured;
    forming a conductive circuit pattern on the substrate;
    conforming the substrate to create a three-dimensional printed circuit assembly; and
    curing the three-dimensional printed circuit assembly to cause the photoactive polymer to harden further.

2. The method as described in claim 1, wherein the step of forming a substrate comprises:
    providing a reservoir of material capable of altering its physical state when exposed to a radiant beam, the material having a designated upper working surface;
    forming a portion of the substrate by selectively exposing said working surface to the radiant beam, creating a first layer of the substrate;
    coating the partially formed substrate with a further portion of the material by lowering the partially formed substrate into the material;
    continuing to form the substrate by selectively exposing said working surface to the radiant beam; and
    repeating the coating and exposing steps, to form a plurality of successive layers comprising a substrate.

3. The method as described in claim 1, wherein the step of forming a conductive circuit pattern comprises a method selected from the group consisting of screen printing conductive media onto the substrate, forming a pattern by thin film lithography, forming a pattern by electroless plating, forming a pattern by applying a decal having conductive runners, plasma flame spraying, and laminating a flexible circuit onto the substrate.

4. The method as described in claim 1, wherein the step of conforming the substrate comprises heating the substrate on a mold form to cause it to soften and assume the shape of the mold form.

5. The method as described in claim 1, further comprising populating the three-dimensional printed circuit assembly with components.

6. The method as described in claim 5, wherein the step of curing the three-dimensional printed circuit assembly and the step of populating the three-dimensional printed circuit assembly with components are performed in a single step.

7. The method as described in claim 1, further comprising a final step of further transforming the three-dimensional printed circuit assembly by exposing it to a further source of radiant energy.

8. The method as described in claim 6, further comprising a final step of further transforming the three-dimensional printed circuit assembly by exposing it to a further source of radiant energy.

9. A method of making a three-dimensional printed circuit assembly, comprising the steps of:
    forming a substrate by means of stereolithography, the substrate being only partially cured;
    forming a conductive circuit pattern on the substrate;
    shaping the substrate to provide three-dimensional features by heating and softening the substrate to conform it to the shape of a mold form, thereby creating a three dimensional printed circuit assembly;
    curing the shaped substrate to cause it to crosslink; and
    populating the substrate with components.

10. The method as described in claim 8, further comprising populating the substrate with components.

11. A method of making a three-dimensional printed circuit, comprising the steps of:
    forming a substrate by;
    selectively exposing a working surface of a liquid photopolymer to a radiant beam to partially cure the photopolymer and create a first layer of the substrate;

applying a coating of the liquid photopolymer to the first layer of the substrate;

selectively exposing the coating to the radiant beam to continue to form the substrate; and repeating the steps of applying a coating and selectively exposing, to form a plurality of successive layers comprising a substrate;

forming a conductive circuit pattern on the substrate;

shaping the substrate to provide a three-dimensional printed circuit by heating and softening the substrate to cause it to assume the shape of a mold form; and curing the substrate further to cause the partially cured photopolymer to harden in the shape of the mold form.

12. The method as described in claim 11, further comprising populating the three-dimensional printed circuit with components.

13. The method as described in claim 9, wherein the step of forming a conductive circuit pattern comprises a method selected from the group consisting of screen printing conductive media onto the substrate, forming a pattern by thin film lithography, forming a pattern by electroless plating, forming a pattern by applying a decal having conductive runners, plasma flame spraying, and laminating a flexible circuit onto the substrate.

14. The method as described in claim 11, wherein the step of forming a conductive circuit pattern comprises a method selected from the group consisting of screen printing conductive media onto the substrate, forming a pattern by thin film lithography, forming a pattern by electroless plating, forming a pattern by applying a decal having conductive runners, plasma flame spraying, and laminating a flexible circuit onto the substrate.

* * * * *